(12) United States Patent
Yudanov et al.

(10) Patent No.: US 11,599,384 B2
(45) Date of Patent: Mar. 7, 2023

(54) CUSTOMIZED ROOT PROCESSES FOR INDIVIDUAL APPLICATIONS

(71) Applicant: Micron Technology, Inc., Boise, ID (US)

(72) Inventors: Dmitri Yudanov, Rancho Cordova, CA (US); Samuel E. Bradshaw, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 243 days.

(21) Appl. No.: 16/592,529

(22) Filed: Oct. 3, 2019

(65) Prior Publication Data
US 2021/0103462 A1 Apr. 8, 2021

(51) Int. Cl.
| | |
|---|---|
| G06F 9/46 | (2006.01) |
| G06F 9/48 | (2006.01) |
| G11C 11/409 | (2006.01) |
| G06F 11/30 | (2006.01) |
| G06F 9/38 | (2018.01) |

(52) U.S. Cl.
CPC ............ *G06F 9/485* (2013.01); *G06F 9/3842* (2013.01); *G06F 11/302* (2013.01); *G11C 11/409* (2013.01)

(58) Field of Classification Search
CPC ..... G06F 9/485; G06F 9/3842; G06F 9/45558
See application file for complete search history.

(56) References Cited

U.S. PATENT DOCUMENTS

| | | | |
|---|---|---|---|
| 4,476,524 A | 10/1984 | Brown et al. | |
| 5,218,677 A | 6/1993 | Bono et al. | |
| 6,138,179 A * | 10/2000 | Chrabaszcz | ........... G06F 3/0605 710/10 |
| 6,976,114 B1 | 12/2005 | Ware | |
| 7,370,288 B1 | 5/2008 | Simmons et al. | |
| 8,001,266 B1 * | 8/2011 | Gonzalez | ................ G06F 9/544 370/351 |

(Continued)

FOREIGN PATENT DOCUMENTS

WO 2019171237 9/2019

OTHER PUBLICATIONS

Pramono, Subuh ; Hariyadi, Tommi ; Subagio, Budi Basukiramono, Subuh ; Hariyadi, Tommi ; Subagio, Budi Basuki; Performance of Groundplane Shaping in Four-Element Dualband MIMO Antenna; 2017.*

(Continued)

*Primary Examiner* — Camquy Truong
(74) *Attorney, Agent, or Firm* — Greenberg Traurig

(57) ABSTRACT

A computing device (e.g., a mobile device) can execute a root process of an application to an initial point according to patterns of prior executions of the application. The root process can be one of many respective customized root processes of individual applications in the computing device. The device can receive a request to start the application from a user of the device. And, the device can start the application upon receiving the request to start the application and by using the root process of the application. At least one of the executing, receiving, or starting can be performed by an operating system in the device. The device can also fork the root process of the application into multiple processes, and can start upon receiving the request to start the application and by using at least one of the multiple processes according to the request to start the application.

17 Claims, 8 Drawing Sheets

(56) References Cited

U.S. PATENT DOCUMENTS

| | | | |
|---|---|---|---|
| 8,042,109 B2 * | 10/2011 | Johnson | G06F 9/45533 |
| | | | 718/1 |
| 8,607,023 B1 | 12/2013 | Kraipak et al. | |
| 8,806,140 B1 | 8/2014 | Kraipak et al. | |
| 8,838,887 B1 | 9/2014 | Burke et al. | |
| 8,943,501 B1 | 1/2015 | Havemose | |
| 10,013,500 B1 | 7/2018 | Mcclintock et al. | |
| 10,606,670 B2 | 3/2020 | Zhao et al. | |
| 11,366,752 B2 | 6/2022 | Yudanov | |
| 11,429,445 B2 | 8/2022 | Yudanov et al. | |
| 11,436,041 B2 | 9/2022 | Yudanov et al. | |
| 11,474,828 B2 | 10/2022 | Yudanov et al. | |
| 2002/0013887 A1 | 1/2002 | Ting | |
| 2004/0230687 A1 * | 11/2004 | Nakamura | H04L 29/06 |
| | | | 709/228 |
| 2005/0060174 A1 * | 3/2005 | Heyward | G06Q 10/10 |
| | | | 705/322 |
| 2005/0116958 A1 | 6/2005 | Walls et al. | |
| 2006/0064421 A1 | 3/2006 | Futagawa | |
| 2006/0085679 A1 | 4/2006 | Neary et al. | |
| 2007/0045961 A1 | 3/2007 | Morris | |
| 2007/0070358 A1 | 3/2007 | Ouchi | |
| 2007/0101098 A1 | 5/2007 | Shin et al. | |
| 2007/0130441 A1 | 6/2007 | Wooten | |
| 2007/0186044 A1 | 8/2007 | Fowles | |
| 2007/0226702 A1 * | 9/2007 | Segger | G06F 11/3624 |
| | | | 717/130 |
| 2008/0010431 A1 * | 1/2008 | Chang | G06F 12/0246 |
| | | | 711/202 |
| 2008/0163169 A1 | 7/2008 | Alcott et al. | |
| 2009/0049389 A1 | 2/2009 | Kuzmanovic | |
| 2009/0150541 A1 | 6/2009 | Georgis | |
| 2009/0205034 A1 | 8/2009 | Williams et al. | |
| 2009/0265715 A1 | 10/2009 | Erlingsson et al. | |
| 2009/0307693 A1 | 12/2009 | Do et al. | |
| 2010/0169708 A1 | 7/2010 | Rudelic et al. | |
| 2010/0205395 A1 | 8/2010 | Srinivasan | |
| 2010/0312955 A1 | 12/2010 | Hwang et al. | |
| 2011/0131569 A1 | 6/2011 | Heim | |
| 2012/0110229 A1 | 5/2012 | Woo et al. | |
| 2012/0221785 A1 | 8/2012 | Chung et al. | |
| 2012/0246403 A1 | 9/2012 | Mchale et al. | |
| 2013/0024609 A1 | 1/2013 | Gorobets et al. | |
| 2013/0060946 A1 | 3/2013 | Kenneth et al. | |
| 2013/0124814 A1 | 5/2013 | Carter et al. | |
| 2013/0198459 A1 | 8/2013 | Joshi et al. | |
| 2014/0122329 A1 * | 5/2014 | Naggar | G06Q 20/3552 |
| | | | 705/41 |
| 2014/0168055 A1 | 6/2014 | Smith | |
| 2014/0201126 A1 | 7/2014 | Zadeh et al. | |
| 2014/0215155 A1 | 7/2014 | Miller et al. | |
| 2014/0372356 A1 | 12/2014 | Bilal et al. | |
| 2015/0081964 A1 | 3/2015 | Kihara et al. | |
| 2015/0081978 A1 | 3/2015 | Daly | |
| 2015/0106548 A1 | 4/2015 | Dubois et al. | |
| 2015/0106578 A1 | 4/2015 | Warfield et al. | |
| 2015/0106582 A1 | 4/2015 | Mai et al. | |
| 2015/0178219 A1 | 6/2015 | Aslot et al. | |
| 2015/0301743 A1 | 10/2015 | Nagao et al. | |
| 2016/0019206 A1 | 1/2016 | Mysur et al. | |
| 2016/0085481 A1 | 3/2016 | Antony et al. | |
| 2016/0210049 A1 | 7/2016 | Van Riel et al. | |
| 2017/0017576 A1 | 1/2017 | Cammarota et al. | |
| 2017/0180340 A1 | 6/2017 | Smith et al. | |
| 2017/0185301 A1 | 6/2017 | Mcgiverin et al. | |
| 2017/0262465 A1 * | 9/2017 | Goggin | G06F 16/1748 |
| 2017/0315915 A1 | 11/2017 | Meswani | |
| 2017/0357600 A1 | 12/2017 | Moon | |
| 2018/0024853 A1 | 1/2018 | Warfield et al. | |
| 2018/0046378 A1 | 2/2018 | Coburn et al. | |
| 2018/0046411 A1 | 2/2018 | Coburn et al. | |
| 2018/0204111 A1 | 7/2018 | Zadeh et al. | |
| 2018/0276112 A1 | 9/2018 | Krauss | |
| 2018/0284735 A1 | 10/2018 | Cella et al. | |
| 2018/0293087 A1 | 10/2018 | Lee et al. | |
| 2019/0042453 A1 | 2/2019 | Basak et al. | |
| 2019/0050163 A1 | 2/2019 | Dewey et al. | |
| 2019/0121350 A1 | 4/2019 | Cella et al. | |
| 2019/0138919 A1 | 5/2019 | Chen | |
| 2019/0156207 A1 | 5/2019 | Chen | |
| 2019/0171187 A1 | 6/2019 | Cella et al. | |
| 2019/0179763 A1 | 6/2019 | Lo | |
| 2019/0188162 A1 | 6/2019 | Kwon et al. | |
| 2019/0220318 A1 | 7/2019 | Yang et al. | |
| 2019/0317843 A1 | 10/2019 | Zhao et al. | |
| 2019/0324431 A1 | 10/2019 | Cella et al. | |
| 2019/0339688 A1 | 11/2019 | Cella et al. | |
| 2020/0081658 A1 | 3/2020 | Choi et al. | |
| 2020/0103894 A1 | 4/2020 | Cella et al. | |
| 2020/0117455 A1 | 4/2020 | Ray et al. | |
| 2020/0133254 A1 | 4/2020 | Cella et al. | |
| 2020/0184278 A1 | 6/2020 | Zadeh et al. | |
| 2020/0225655 A1 | 7/2020 | Cella et al. | |
| 2020/0233279 A1 * | 7/2020 | Kikuchi | G02F 1/163 |
| 2020/0272566 A1 | 8/2020 | Saeki | |
| 2020/0348662 A1 | 11/2020 | Cella et al. | |
| 2021/0103446 A1 | 4/2021 | Yudanov et al. | |
| 2021/0103463 A1 | 4/2021 | Yudanov et al. | |
| 2021/0157646 A1 | 5/2021 | Yudanov et al. | |
| 2021/0157718 A1 | 5/2021 | Yudanov et al. | |
| 2021/0294746 A1 | 9/2021 | Yudanov | |
| 2022/0197814 A1 | 6/2022 | Yudanov | |
| 2022/0283936 A1 | 9/2022 | Yudanov | |

OTHER PUBLICATIONS

International Search Report and Written Opinion, PCT/US2020/061306, dated Mar. 9, 2021.

International Search Report and Written Opinion, PCT/US2020/061309, dated Mar. 9, 2021.

International Search Report and Written Opinion, PCT/US2020/053529, dated Jan. 20, 2021.

International Search Report and Written Opinion, PCT/US2020/053537, dated Jan. 20, 2021.

International Search Report and Written Opinion, PCT/US2020/053532, dated Jan. 22, 2021.

Bergan, et al. "Deterministic Process Groups in dOS." The ACM Digital Library, Association for Computing Machinery, 2021.

Xiong, et al. "Memory Access Scheduling Based on Dynamic Multilevel Priority in Shared DRAM Systems." ACM Transactions on Architecture and Code Optimization, vol. 13, No. 4, Article 42, Dec. 2016.

International Search Report and Written Opinion, PCT/US2021/063834, dated Apr. 14, 2022.

Title: Per-process Re-configurable Caches, U.S. Appl. No. 17/132,537, filed Dec. 23, 2020, Status Date: Aug. 31, 2022, Inventor: Dmitri Yudanov, Status: Final Rejection Mailed.

Title: Address Mapping between Shared Memory Modules and Cache Sets, U.S. Appl. No. 16/824,621, filed Mar. 19, 2020, Status Date: Jun. 1, 2022, Inventor: Dmitri Yudanov, Status: Patented Case.

Title: Address Mapping between Shared Memory Modules and Cache Sets, U.S. Appl. No. 17/752,142, filed May 24, 2022, Status Date: Jun. 1, 2022, Inventor: Dmitri Yudanov, Status: Docketed New Case—Ready for Examination.

Title: Customized Root Processes for Groups of Applications, U.S. Appl. No. 16/592,537, filed Oct. 3, 2019, Status Date: Aug. 17, 2022, Inventor: Dmitri Yudanov, et al., Status: Patented Case.

Title: Customized Root Processes for Groups of Applications, U.S. Appl. No. 17/898,642, filed Aug. 30, 2022, Status Date: Sep. 22, 2022, Inventor: Dmitri Yudanov, et al., Status: Docketed New Case—Ready for Examination.

Title: Initial Data Distribution for Different Application Processes, U.S. Appl. No. 16/592,547, filed Oct. 3, 2019, Status Date: Sep. 28, 2022, Inventor: Dmitri Yudanov, et al., Status: Patented Case.

Title: Initial Data Distribution for Different Application Processes, U.S. Appl. No. 17/967,721, filed Oct. 17, 2022, Status Date: Oct. 17, 2022, Inventor: Dmitri Yudanov, et al., Status: Application Undergoing Preexam Processing.

(56) References Cited

OTHER PUBLICATIONS

Title: Reduction of Page Migration between Different Types of Memory, U.S. Appl. No. 16/694,345, filed Nov. 25, 2019, Status Date: Aug. 22, 2022, Inventor: Dmitri Yudanov, et al., Status: Non Final Action Mailed.

Title: Use Interface based Page Migration for Performance Enhancement, U.S. Appl. No. 16/694,371, filed Nov. 25, 2019, Status Date: Aug. 10, 2022, Inventor: Dmitri Yudanov, et al., Status: Patented Case.

Title: User Interface based Page Migration for Performance Enhancement, U.S. Appl. No. 17/898,164, filed Aug. 29, 2022, Status Date: Sep. 21, 2022, Inventor: Dmitri Yudanov, et al., Status: Docketed New Case—Ready for Examination.

\* cited by examiner

200 executing a root process of an application to an initial point according to patterns of prior executions of the application
202 receiving a request to start the application from a user
204 starting the application upon receiving the request to start the application and by using the root process of the application
206

FIG. 2

CUSTOMIZED ROOT PROCESSES FOR INDIVIDUAL APPLICATIONS

FIELD OF THE TECHNOLOGY

At least some embodiments disclosed herein relate to root processes for computing systems in general, and more particularly to customized root processes for individual applications in a computing device.

BACKGROUND

The innerworkings of the ANDROID operating system include a zygote that acts as a parent or root process of all ANDROID application processes. In UNIX and operating systems similar to UNIX (such as LINUX and ANDROID), any non-initial process (or any non-zero process) can be at least partially derived from the initial or zero process of the operating system (OS). Thus, the use of the term "zygote" by the ANDROID OS to reference its root process or process 0.

ANDROID is a mobile OS for mobile devices developed by GOOGLE. It is based on a modified version of the LINUX kernel and other open source software, and is designed primarily for mobile devices (e.g., smartphones, tablets, etc.). GOOGLE has also developed versions of ANDROID for the Internet of Things (IoTs). And, versions of ANDROID have been developed for televisions and other household appliances, in-vehicle information systems, wearable smart devices, game consoles, digital cameras, and other types of electronics including PCs.

The creation of a non-zero process by ANDROID, UNIX, or another OS similar to UNIX, occurs when another process executes the system call represented by "fork( )", which causes forking of a process into multiple processes. The process that invoked the forking is the parent process and a newly created process is a child process. In UNIX or operating systems similar to UNIX, the kernel can identify each process by its process identifier, e.g., "0" for the initial or zero process. In UNIX and similar operating systems, the zero process (i.e., process 0) is a root process generated when the OS boots. A first child process (e.g., process 1), known as "init", can at least be partially derived from the zero process and can become the ancestor of every other process in the OS.

BRIEF DESCRIPTION OF THE DRAWINGS

The present disclosure will be understood more fully from the detailed description given below and from the accompanying drawings of various embodiments of the disclosure.

FIGS. 2, 4, 5, and 6 illustrate flow diagrams of example operations that can be performed by the mobile device depicted in FIGS. 1 and 3, in accordance with some embodiments of the present disclosure.

DETAILED DESCRIPTION

Figure 1:
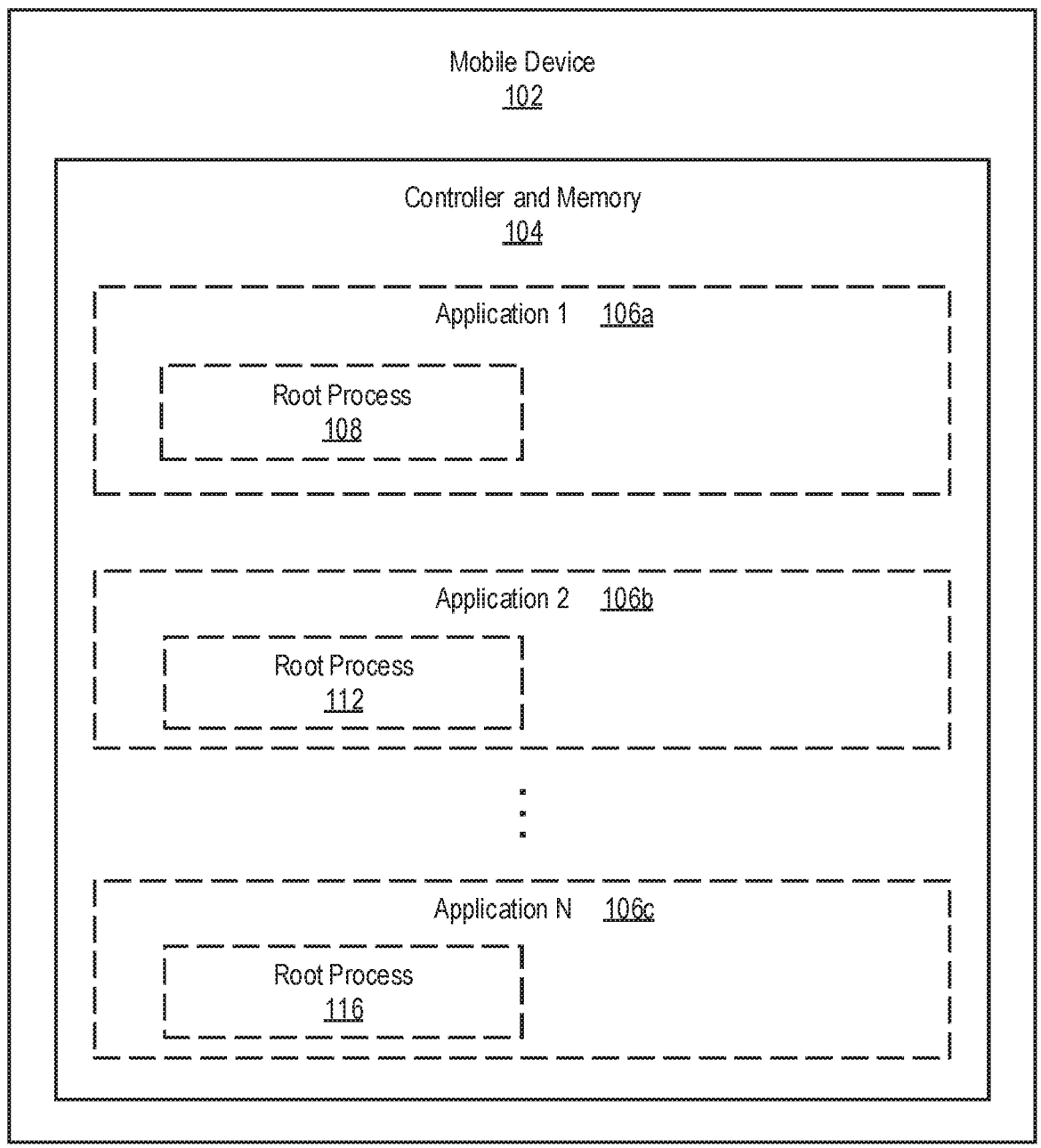
FIGS. 1 and 3 illustrate an example mobile device including and running respective root processes for multiple applications, in accordance with some embodiments of the present disclosure.

At least some embodiments disclosed herein relate to root processes for computing systems in general, and more particularly to customized root processes for individual applications in a computing device.

Some embodiments disclosed herein relate to an operating system (OS) or hypervisor or the like of one or more computing devices that is configured to monitor usage of one or more applications by a user in the one or more devices. For example, some embodiments can relate to an OS of a mobile device that is configured to monitor usage of an application in the device by a user. The monitoring of such embodiments can identify typical initial reads or writes by an application that cause the OS, hypervisor, or the like to read from memory and write into memory for the application. The monitoring can also include monitoring of usage patterns of the application and related applications (e.g., data access patterns, typical day of week used by the user, time of day usually used, other application used that correlates to use of the application, etc.). The initial reads and writes can be stored or cached in memory to be used via a respective root process particularly for the application. The initial reads and writes can be managed, maintained, prioritized etc., by the OS, hypervisor or the like, via the memory, according to frequency of use, recency of use, etc. In some embodiments, storing or caching can be done in faster memory for accelerating the initial reads and writes.

In some embodiments, instructions and/or data for the root process of an application can be stored in a persistent, non-volatile memory such as flash memory or non-volatile random-access memory (NVRAM). NVRAM can include 3D XPoint memory in some embodiments.

The root process for an application can be launched on startup of the OS, hypervisor or the like. In some embodiments, the root process of the application can be killed if the application is not used within a certain time period or if application consumes too much system resources such as CPU, GPU, memory or other resource. In such embodiments, in anticipation of use of the application, the OS, hypervisor or the like can be configured to re-launch the root process according to identified patterns in the monitoring of the application. Preference to patterns can be based on quantify, frequency and/or recency of the patterns, and any type of memory access patterns for the application can be monitored and tracked. The monitoring and tracking can include hardware and software performance counters, which are available through an OS via reading and writing special registers (e.g., model specific registers). Patterns can be based on metrics such as quantity, frequency and/or recency of reads from memory, writes to memory, address patterns in physical memory space, address patterns in virtual space, locality of data (spatially and/or temporally), bank conflicts, or CPU cycles per instruction. Patterns can also be based on metrics such as quantity, frequency and/or recency of translation lookaside buffer (TLB) metrics and other metrics available to an OS.

In some embodiments, after an application is installed in a computing device (such as a mobile device), the OS of the device or an associated hypervisor can pre-launch the application to generate root application process that is customized for the user. The pre-launch can occur before the user requests the computing device to start the application. The application can be at least partially executed via an OS or hypervisor or the like. Thus, the pre-launch process or root process of the application is different from the root process of the OS. In such embodiments, the OS or hypervisor or the like can move and/or copy data to set up the root process of the application. In some embodiments, the copying and/or moving of the data initially can be done by a root process of the OS. This can occur before any initial reads or writes for the application such as by a root process of the application. In some embodiments, common code and read-only data (e.g. libraries, runtimes, drivers, memory pages) are not copied and/or moved by the root process of the OS or a respective root process of an application. In some embodiments, code and data of a root process are not copied until initial modification of code and data by a root process, another process or the OS. In some embodiments, only modified parts of code and data are copied, but not modified parts remain common. In some embodiments these parts can be identified by monitoring writes to memory pages, cache lines or file system sectors or other elements of computer-readable storage medium.

The computing device (e.g., a mobile device) can monitor the frequent or recent usage of the application by the user to determine initial reads and writes to add to the root process of the application. This can cause the OS, hypervisor, or the like to read from and/or write into memory for the application. The data moving and/or copying as a result of the initial writes can also be performed before the user requests the OS, hypervisor or the like to start the application.

After the OS, hypervisor, or the like forks a system-level root process, the predicted initial reads and/or writes for the application can be used to customize the application's root process. In such examples, the customized root process of the application can be saved in a persistent non-volatile memory (e.g., flash memory and/or NVRAM) for fast starting of the application.

When the user requests the OS, hypervisor, or the like to start the application, the OS, hypervisor, or the like can use the pre-launched process of the application (i.e., the root process of the application), or a forked process from the pre-launched process to service the user. The forked process from the root process of the application can be similar to or different from the root process.

Also, when the user kills the application, the OS can kill the active process of the application and/or the root process of the application, completely or partially. In anticipation that the user will run the application, the OS, hypervisor, or the like can re-launch the root process of the application, which can be further customized based on most recent and/or frequent user usage patterns of the application.

Figure 3:
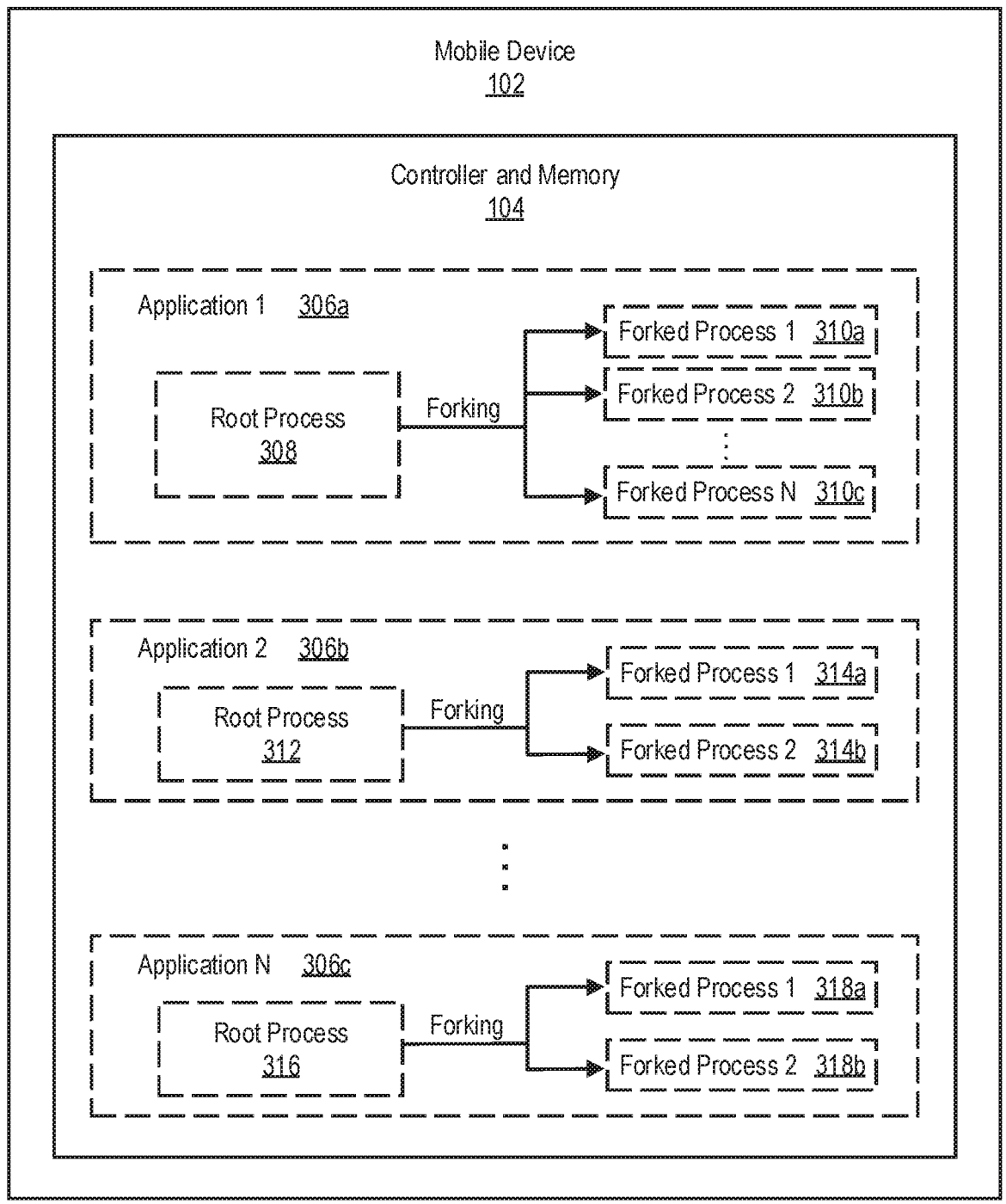

FIGS. 1 and 3 illustrate an example mobile device 102 including and running respective root processes for multiple applications, in accordance with some embodiments of the present disclosure. FIGS. 2, 4, 5, and 6 illustrate flow diagrams of example methods 200, 400, 500, and 600 that can be performed by the mobile device 102 depicted in FIGS. 1 and 3, in accordance with some embodiments of the present disclosure.

Specifically, FIG. 1 Illustrates mobile device 102 that at least includes a controller and memory 104. The controller and memory 104 of mobile device 102 can include instructions and data for applications executed in the mobile device (e.g., see applications 106a, 106b, and 106c). The controller of the mobile device 102 can execute the instructions for the applications based on the data. The data can include application instruction code in binary format or in a format suitable for interpreting by programming language interpreter. The data can include some data structures, libraries etc. The controller can also hold the instructions and data in registers of the controller. The memory can hold the instructions and data in its memory cells. In some embodiments, the memory cells of the memory of the mobile device 102 can include flash memory cells and/or NVRAM cells. The NVRAM cells can be or include 3D XPoint memory cells.

In some embodiments, the memory can have different speeds, latencies, bandwidths and other parameters. For example, SRAM memory can be used as high-speed cache, DRAM as the main memory, and NVRAM as storage memory.

The instructions and data for each application included and runnable in the mobile device 102 can include root process data and instructions for a root process of the application. The respective root process of an application included in the mobile device 102 (e.g., see root process 108 of application 106a, root process 112 of application 106b, and root process 116 of application 106c) can be implemented by the controller and the memory 104. The controller can be configured to execute the instructions of the root process according to the instructions and data for the root process, and the memory can be configured to hold or store the instructions and the data for execution of the root process by the controller.

The other processes of the application included in the mobile device 102 (e.g., see applications 106a, 106b and 106c) can be implemented by the controller and the memory 104 too. The controller can be configured to execute the instructions of the other processes of the application according to the instructions and data for the other processes, and the memory can be configured to hold or store the instructions and the data for execution of the other processes by the controller.

Specifically, FIG. 2 illustrates operations of method 200 that can be performed by the mobile device 102 depicted in FIG. 1 or by another type of computing device configured similarly to the mobile device 102. Also, in some embodiments, the method 200 can be performed at least partially by an OS of a computing device in general or an OS of a mobile device. The method 200 can also be performed at least partially by a hypervisor and/or one or more operating systems.

In FIG. 2, the method 200 begins at step 202 with executing a root process of an application to an initial point according to patterns of prior executions of the application. Also, the method 200 can begin with customizing a root process of an application according to patterns of prior executions of the application, and then executing the root process of the application to the initial point according to the patterns of prior executions of the application.

Patterns of prior executions of the application can include, be related to, or be based on at least quantity, frequency and/or recency of patterns in prior executions of the application that are monitored and/or tracked. The patterns monitored and/or tracked can be any type of pattern of application usage by a user or a machine. For example, any type of pattern of memory access and usage for the application can be monitored and/or tracked. Patterns of prior executions of the application can include, be related to, or be based on metrics such as at least quantity, frequency and/or recency of any type of pattern of application usage by a user or a machine. For example, patterns can include, be related to, or be based on metrics such as quantity, frequency and/or recency of reads from memory, writes to memory, address patterns in physical memory space, address patterns in virtual space, locality of data (spatially and/or temporally), bank conflicts, CPU cycles per instruction, etc.

The executing the root process of the application can include moving data in memory before any initial writes to and/or reads from memory for the application. Also, the executing the root process of the application can include copying data in memory before any initial writes to and/or reads from memory for the application. And, the moved and/or copied data can include data related to the patterns of prior executions of the application. In some embodiments, the moving and/or copying of data in memory before any initial writes to memory can include avoiding moving and/or copying common code and read-only data. In some embodiments, the method 200 can include, after an OS (or hypervisor) in the computing device forks a root process for the OS (or hypervisor), executing predicted initial writes and/or reads for the application to customize the executing of the root process of the application such that the root process of the application is an application-level process for the application.

Also, the method 200 can include storing data for the root process of the application in flash memory before at least part of the execution of the root process (not depicted in the drawings). The method 200 can also include storing data for the root process of the application in NVRAM before at least part of the execution of the root process (not depicted in the drawings). The NVRAM can include 3D XPoint memory. In some embodiments storing new data can overwrite old unused data related to the usage of the applications.

At step 204, the method 200 continues with receiving a request to start the application from a user. At step 206, the method 200 continues with starting the application upon receiving the request to start the application and by using the root process of the application. In some embodiments, the method 200 can include executing, at least partially by an OS in a computing device, a root process of an application as a background process according to patterns of prior executions of the application. In such embodiments, the method 200 can also include receiving, by the OS, a request to start the application from a user of the computing device. And, the method 200 can include starting, by the OS, the application in the computing device upon receiving the request to start the application and by using the root process of the application or a forked process of the root process. In some embodiments, code and data of a forked process are not copied until an initial modification of code and data by the application, another process or the OS. In some embodiments, only modified parts of code and data are copied, but not modified parts remain common. In some embodiments, such parts can be identified by monitoring writes to memory pages, cache lines or file system sectors or other elements of computer-readable storage medium.

In some embodiments, executing a root process to an initial point can be done on one device, e.g. in cloud computing environment, then forking it upon receiving a request from another device to start at least one of the applications, then transferring a forked process over network to another device, e.g. mobile device, then using the forked process on a mobile deice as a starting point for application.

In some embodiments, the method 200 can include executing, in a computing device (e.g., a mobile device) or multiple computing devices, a root process of an application to an initial point according to patterns of prior executions of the application—at step 202. The method 200 can also include receiving, by the computing device(s), a request to start the application from a user of the computing device(s)—at step 204. The method 200 can also include starting the application in the computing device(s) upon receiving the request to start the application and by using the root process of the application—at step 206. In such embodiments, each step or at least some of the steps of method 200 can be performed by an operating system of the computing device(s), one or more operating systems of the computing device(s), a hypervisor, or any combination thereof. For example, at least one of the executing, receiving, or starting steps can be at least partially performed by an OS in the computing device(s).

Specifically, FIG. 3 Illustrates the mobile device 102, which at least includes a controller and memory 104. As shown in FIG. 3, the controller and memory 104 of mobile device 102 can include instructions and data for applications executed in the mobile device (e.g., see applications 306a, 306b, and 306c). The controller of the mobile device 102 can execute the instructions for the applications based on the data. The data can include application instruction code in binary format or in a format suitable for interpreting by programming language interpreter. The data can include some data structures, libraries etc. The controller can also hold the instructions and data in registers of the controller. The memory can hold the instructions and data in its memory cells. In some embodiments, the memory cells of the memory of the mobile device 102 can include flash memory cells and/or NVRAM cells.

As shown in FIG. 3 as well, the instructions and data for each application included and runnable in the mobile device 102 can include root process data and instructions for a root process of the application. The root process of an application included in the mobile device 102, as shown in FIG. 3, e.g., see respective root processes 308, 312 and 316, can be implemented by the controller and the memory 104. The controller configured to execute the instructions of the root process according to the instructions and data for the root process, and the memory configured to hold or store the instructions and the data for execution of the root process by the controller. Also, as illustrated by FIG. 3, the other processes of the application included in the mobile device 102 (e.g., see applications 306a, 306b and 306c) can be implemented by the controller and the memory 104 too. The controller configured to execute the instructions of the other processes of the application according to the instructions and data for the other processes, and the memory configured to hold or store the instructions and the data for execution of the other processes by the controller.

Additionally, as shown in FIG. 3, the controller and memory 104 can include data and instructions for multiple processes forked from the respective root processes of the applications stored and runnable in the mobile device 102 (e.g., see forked processes 310a, 310b, 310c, 314a, 314b, 318a, and 318b). As shown in FIG. 3, at least processes 310a, 310b, and 310c are forked from root process 308; but, there may be more processes forked from root process 308. Also shown, processes 314a and 314b are forked from root process 312. And, processes 318a and 318b are forked from root process 316.

In some embodiments, an operating system of the mobile device 102, or a hypervisor in or associated with the mobile device, is configured to fork a root process of an application (e.g., see root process 308 of application 306a, root process 312 of application 306b, and root process 316 of application 306c) into multiple processes (e.g., see forked processes 310a, 310b, 310c, 314a, 314b, 318a, and 318b). In such embodiments, the operating system, or the hypervisor, can be configured to start the application in the mobile device 102 upon receiving a request to start the application and by using at least one of the multiple forked processes (e.g., see forked processes 310a, 310b, 310c, 314a, 314b, 318a, and 318b) and/or the respective root process according to the request to start the application (e.g., see root process 308 of application 306a, root process 312 of application 306b, and root process 316 of application 306c).

At least some or each of the forked multiple processes can be different from the parent root process of the application. The differences can be based on different applications and different application parts in the computing device to be run. And, at least some or each of the forked multiple processes can be identical to the parent root process of the application at least at some point of execution of the application.

In some embodiments, an initial execution of a forked root process can be limited to pre-loading libraries, composing a forked process out of required libraries and initial data structures, and saving the forked process for further reuse. Also, at any time, execution of a forked process can be saved in memory at some state so that it can be re-used in order to avoid spending time on re-executing the process.

Figure 4:
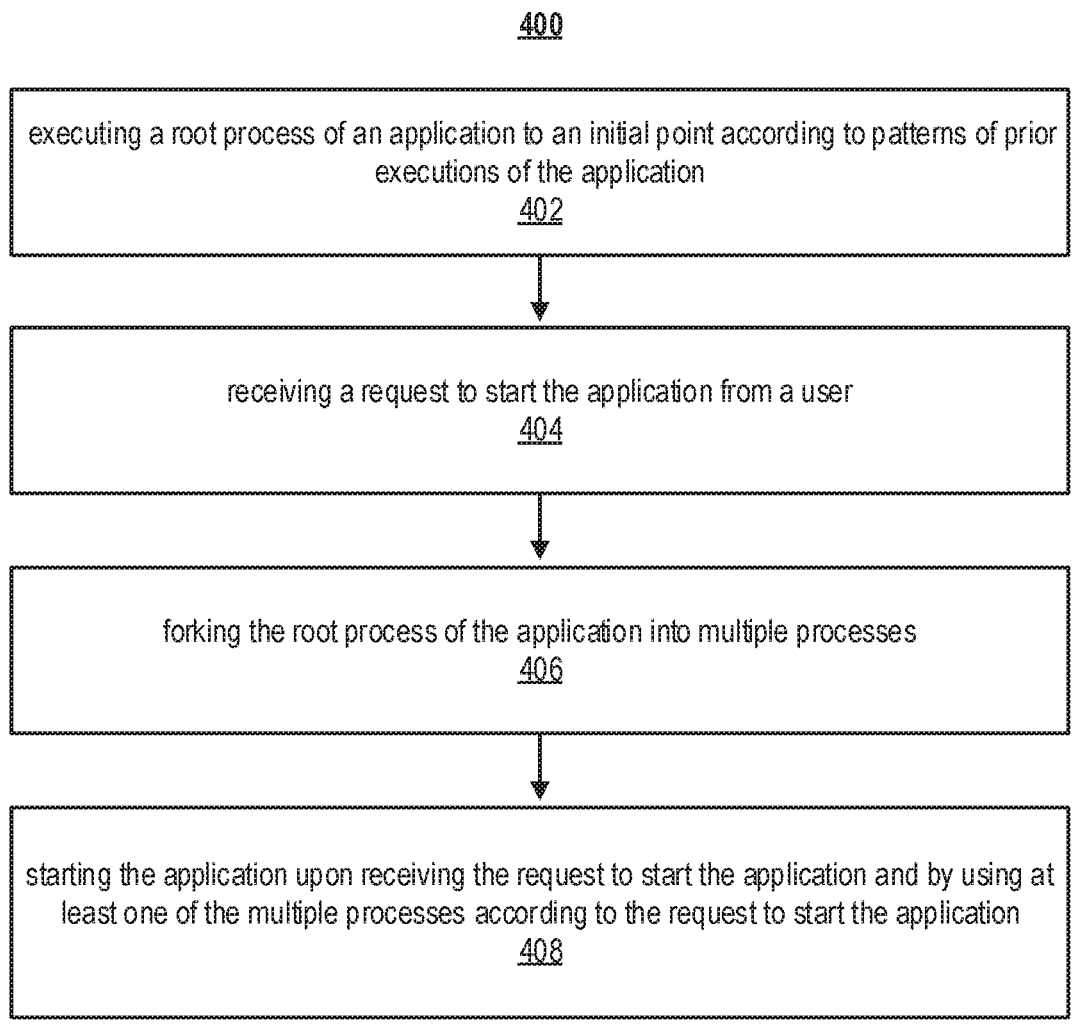

Specifically, FIG. 4 illustrates operations of method 400 that can be performed by the mobile device 102 depicted in FIG. 3 or by another type of computing device configured similarly to the mobile device 102. Also, in some embodiments, the method 400 can be performed by an operating system of a computing device in general or an operating system of a mobile device. The method 400 can also be performed at least partially by a hypervisor and/or one or more operating systems.

In FIG. 4, the method 400 begins at step 402 (which is similar to step 202 depicted in FIG. 2) with executing a root process of an application to an initial point according to patterns of prior executions of the application. Also, the method 400 can begin with customizing a root process of an application according to patterns of prior executions of the application, and then executing the root process of the application to the initial point according to the patterns of prior executions of the application.

Patterns of prior executions of the application can include, be related to, or be based on at least quantity, frequency and/or recency of patterns in prior executions of the application that are monitored and/or tracked. The patterns monitored and/or tracked can be any type of pattern of application usage by a user or a machine. For example, any type of pattern of memory access and usage for the application can be monitored and/or tracked. Patterns of prior executions of the application can include, be related to, or be based on metrics such as at least quantity, frequency and/or recency of any type of pattern of application usage by a user or a machine. For example, patterns can include, be related to, or be based on metrics such as quantity, frequency and/or recency of reads from memory, writes to memory, address patterns in physical memory space, address patterns in virtual space, locality of data (spatially and/or temporally), bank conflicts, CPU cycles per instruction, etc.

The executing the root process of the application can include moving data in memory before any initial writes to and/or reads from memory for the application. Also, the executing the root process of the application can include copying data in memory before any initial writes to and/or reads from memory for the application. And, the moved and/or copied data can include data related to the patterns of prior executions of the application. In some embodiments, the moving and/or copying of data in memory before any initial writes to memory can include avoiding moving and/or copying common code and read-only data. In some embodiments, the method 400 can include, after an operating system (or hypervisor) in the computing device forks a root process for the operating system (or hypervisor), executing predicted initial writes and/or reads for the application to customize the executing of the root process of the application such that the root process of the application is an application-level process for the application.

Also, the method 400 can include storing data for the root process of the application in flash memory before at least part of the execution of the root process (not depicted in the drawings). The method 400 can also include storing data for the root process of the application in NVRAM before at least part of the execution of the root process (not depicted in the drawings). The NVRAM can include 3D XPoint memory.

At step 404 (which is similar to step 204 shown in FIG. 2), the method 400 continues with receiving a request to start the application from a user. At step 406, the method 400 continues with forking the root process of the application into multiple processes. At step 408, the method 400 continues with starting the application upon receiving the request to start the application and by using at least one of the multiple processes according to the request to start the application. Alternatively, at step 408, the method 400 can continue with starting the application upon receiving the request to start the application and by using at least one of the parent root process (e.g., see root process 308) and the multiple processes (e.g., see forked processes 310a, 310b, and 310c) according to the request to start the application.

In some embodiments, the method 400 can include executing, in a computing device (e.g., a mobile device) or multiple computing devices, a root process of an application to an initial point according to patterns of prior executions of the application—at step 402. The method 400 can also include receiving, by the computing device(s), a request to start the application from a user of the computing device(s)—at step 404. The method 400 can also include forking, by the computing device (such as by the OS of the computing device), the root process of the application into multiple processes—at step 406. The method 400 can also include starting the application in the computing device upon receiving the request to start the application and by using at least one of the multiple processes according to the request to start the application—at step 408.

In such embodiments, each step or at least some of the steps of method 400 can be performed by an operating system of the computing device(s), one or more operating systems of the computing device(s), a hypervisor, or any combination thereof. For example, at least one of the executing, receiving, or starting steps can be performed by an OS in the computing device(s). In some embodiments, the method 400 can include forking the root process of the application into multiple identical processes—at step 406, and starting the application in the mobile device upon receiving the request to start the application and by using at least one of the multiple identical processes according to the request to start the application—at step 408.

With respect to method 400, at least some or each of the forked multiple processes can be different from the parent root process of the application. The differences can be based on different applications and different application parts in the computing device to be run. And, at least some or each of the forked multiple processes can be identical to the parent root process of the application at least at some point of execution of the application.

In some embodiments, such as embodiments that can implement methods 200 and 400, the patterns of prior executions of the application are from use of the application on a particular computing device (e.g., a particular mobile device) by a particular user and other users so that the root process is customized for use of the application on the particular computing device by any user.

In some other embodiments, such as some other embodiments that can implement methods 200 and 400, the patterns of prior executions of the application are from use of the application on a particular computing device (e.g., a particular mobile device) by a particular user so that the root process is customized for use of the application on the particular mobile device by the particular user.

In some other embodiments, such as some other embodiments that can implement methods 200 and 400, the patterns of prior executions of the application are from use of a particular application on a particular computing device (e.g., a particular mobile device) and at least one other computing device by a particular user so that the root process is customized for use of the application on the computing device and the at least one other computing device by the particular user.

Customizing a root process can be done, but not limited to, composing it from various libraries, using other root processes available by default, forming data structures, and querying various sources over the network for root process components.

Figure 5:
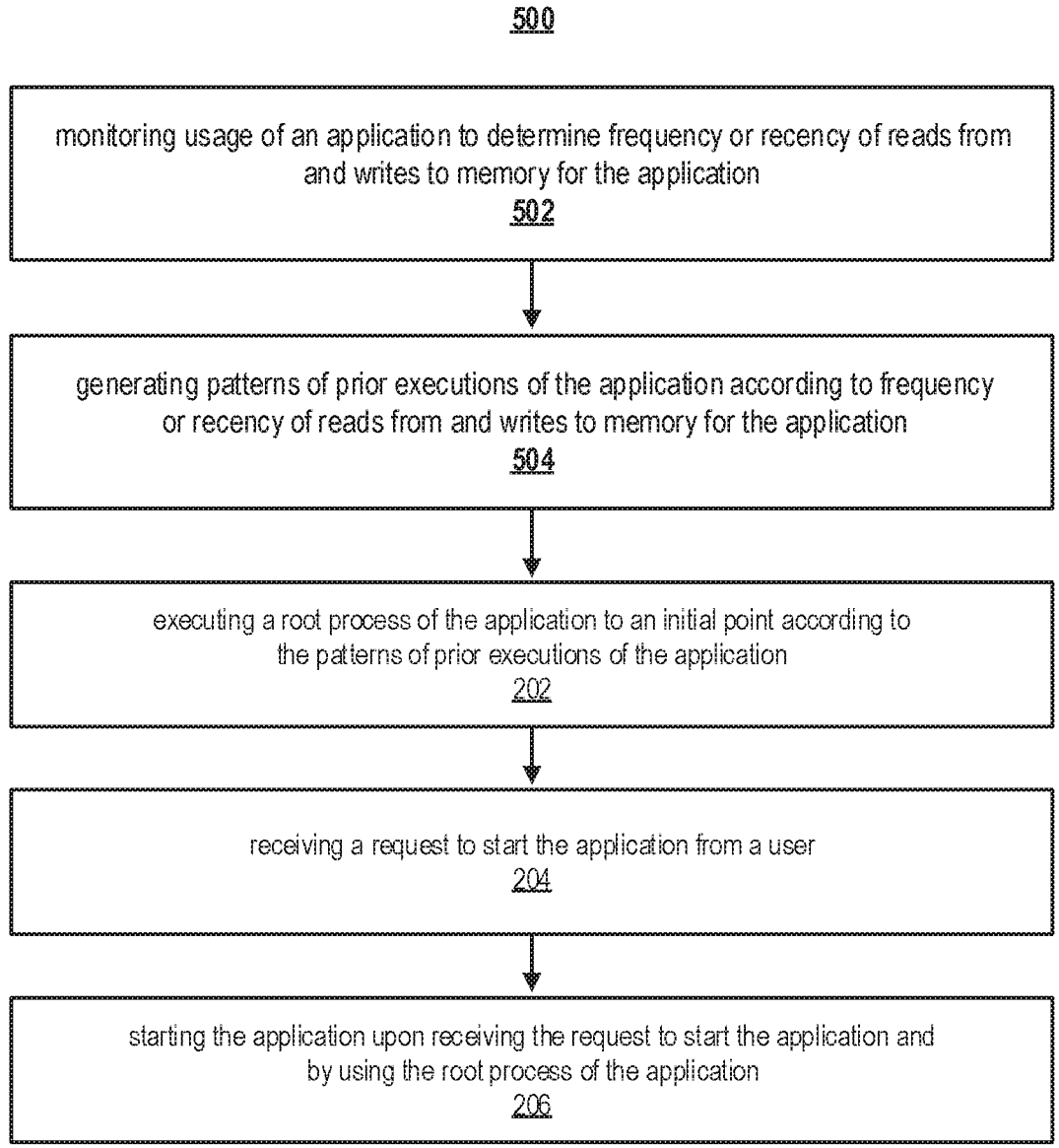

Specifically, FIG. 5 illustrates operations of method 500 that can be performed by the mobile device 102 depicted in FIGS. 1 and 3 or by another type of computing device configured similarly to the mobile device 102. Also, in some embodiments, the method 500 can be performed by an operating system of a computing device in general or an operating system of a mobile device. The method 200 can also be performed at least partially by a hypervisor and/or one or more operating systems.

In FIG. 5, the method 500 begins at step 502 with monitoring usage of the application to determine frequency or recency of reads from and writes to memory for the application. In some embodiments (not depicted), the method 500 can begin with monitoring and/or tracking usage of the application to determine quantity, frequency and/or recency of patterns of prior executions of the application.

The patterns of prior executions of the application can include, be related to, or be based on at least quantity, frequency and/or recency of patterns in prior executions of the application that are monitored and/or tracked. The patterns monitored and/or tracked can be any type of pattern of application usage by a user or a machine. For example, any type of pattern of memory access and usage for the application can be monitored and/or tracked. Patterns can include, be related to, or be based on metrics such as quantity, frequency and/or recency of reads from memory, writes to memory, address patterns in physical memory space, address patterns in virtual space, locality of data (spatially and/or temporally), bank conflicts, CPU cycles per instruction, etc.

Also, monitoring and tracking usage of the application can occur during initiation of the application (e.g., including when the application is being loaded to memory) and/or afterwards during running of the application. The monitoring and tracking usage of the application can occur during initiation of the application and at any other period of running the application post-initiation. Monitoring and tracking usage of the application during runtime can facilitate derivation of an effective and/or efficient root process of the application. For example, after initiation a user can touch a screen to trigger some element of application and expect some result. The delivery of that result can be very quick in some embodiments since a critical memory object can be preloaded based on the monitoring that occurs during runtime of the application. In some embodiments, the preloading of the object can be done from slower memory such as NAND-type Flash memory to faster memory such as DRAM.

At step 504, the method 500 continues with generating the patterns of prior executions of the application according to the frequency or recency of reads from and writes to memory for the application. In some embodiments (not depicted), the method 500 can continue with generating the patterns of prior executions of the application according to the quantity, frequency and/or recency of patterns in prior executions of the application that are monitored and/or tracked.

Also, the generated patterns of prior executions of the application can include, be related to, or be based on at least quantity, frequency and/or recency of patterns in prior executions of the application that are monitored and/or tracked. The patterns generated at step 504 can be any type of pattern of application usage by a user or a machine. For example, the patterns generated, at step 504, can include any type of pattern of memory access and usage for the application can be monitored and/or tracked. Also, for example, the generated patterns can include, be related to, or be based on metrics such as quantity, frequency and/or recency of reads from memory, writes to memory, address patterns in physical memory space, address patterns in virtual space, locality of data (spatially and/or temporally), bank conflicts, or any other types of metrics related to usage of the application and memory for the application.

As shown in FIG. 5, the method 500 continues with the steps from method 200 after step 504. For example, after step 504, the method continues with step 202 of executing a root process of an application to an initial point according to the patterns of prior executions of the application which were generated at step 504. Then, the method 500 continues with, at step 204, receiving a request to start the application from a user. And, the method 500 continues with, at step 206, starting the application upon receiving the request to start the application and by using the root process of the application.

Figure 6:
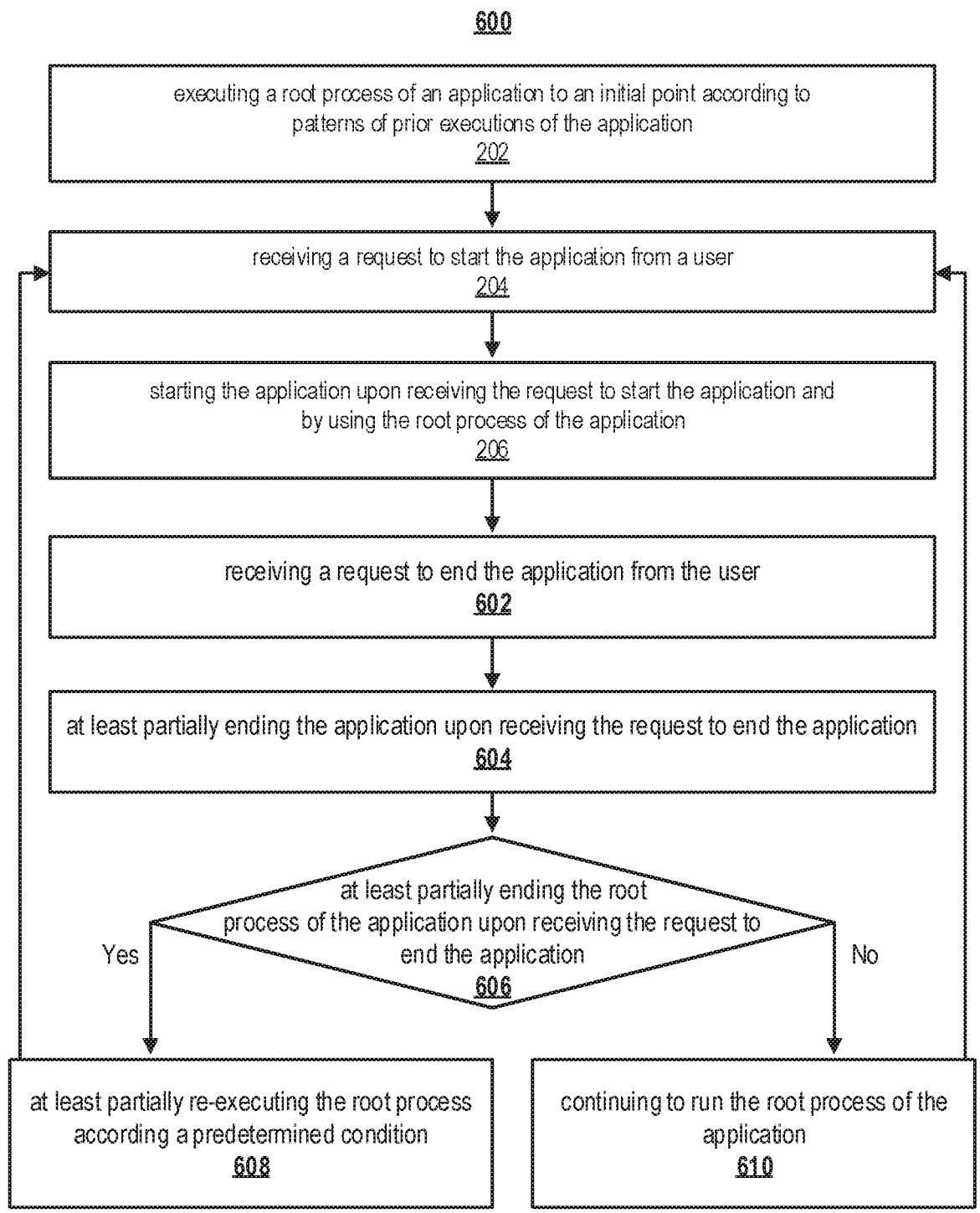

Specifically, FIG. 6 illustrates operations of method 600 that can be performed by the mobile device 102 depicted in FIGS. 1 and 3 or by another type of computing device configured similarly to the mobile device 102. Also, in some embodiments, the method 600 can be performed by an operating system of a computing device in general or an operating system of a mobile device. The method 600 can also be performed at least partially by a hypervisor and/or one or more operating systems.

As shown in FIG. 6, the method 600 begins with the steps from method 200. The method 600 begins with step 202 of executing a root process of an application to an initial point according to the patterns of prior executions of the application. Then, the method 600 continues with, at step 204, receiving a request to start the application from a user. And, the method 600 continues with, at step 206, starting the application upon receiving the request to start the application and by using the root process of the application.

At step 602, the method 600 continues with receiving a request to end the application from the user. For example, at step 602, the method 600 continues with receiving a request to end the application from the user of the computing device (e.g., the user of the mobile device).

At step 604, the method 600 continues with at least partially ending the application upon receiving the request to end the application. At step 606, the method 600 continues with at least partially ending the root process of the application upon receiving the request to end the application.

As shown in FIG. 6, at step 608, when step 606 is completed, the method 600 continues with at least partially re-executing the root process according a predetermined condition (after at least partially ending the application and the root process). At step 608, the at least partially re-executing of the root process can occur based on the patterns of prior executions of the application. Also, at step 608, the at least partially re-executing of the root process can be updated by the patterns of prior executions of the application.

As shown in FIG. 6, at step 610, when step 606 is not completed, the method 600 moves forward with continuing to run the root process of the application upon receiving the request to end the application. In other words, the method 600 can include receiving a request to end the application from the user of the mobile device at step 602, and then at step 604, it can include at least partially ending the application upon receiving the request to end the application, and then at step 610, it can include continuing to run the root process of the application upon receiving the request to end the application and without stopping the root process in between steps 604 and 610. As a result of this, the root process of the application can be re-used again should the user decide to re-start the at least partly ended application or other application, for which this root-process can be used.

With respect to the method 200, method 400, method 500, method 600, or any other method, process, or operation described herein, in some embodiments, a non-transitory computer-readable storage medium stores instructions that, when executed by at least one processing device (such as controller 706 shown in FIG. 7), cause the at least one processing device to perform the method 200, method 400, method 500, method 600, or any other method, process, or operation described herein, and/or any combination thereof.

For example, some embodiments can include a non-transitory computer-readable storage medium tangibly encoded with computer-executable instructions, that when executed by a processor associated with a computing device, performs a method such as the method 200 shown in FIG. 2. For example, the method can include executing, in a mobile device, a root process of an application to an initial point according to patterns of prior executions of the application. The method can also include receiving a request to start the application from a user of the mobile device. And, the method can include starting the application in the mobile device upon receiving the request to start the application and by using the root process of the application.

Also, for example, some embodiments can include a non-transitory computer-readable storage medium tangibly encoded with computer-executable instructions, that when executed by a processor associated with a computing device, performs a method such as the method 400 shown in FIG. 4, the method 500 shown in FIG. 5, and the method 600 shown in FIG. 6.

Figure 7:
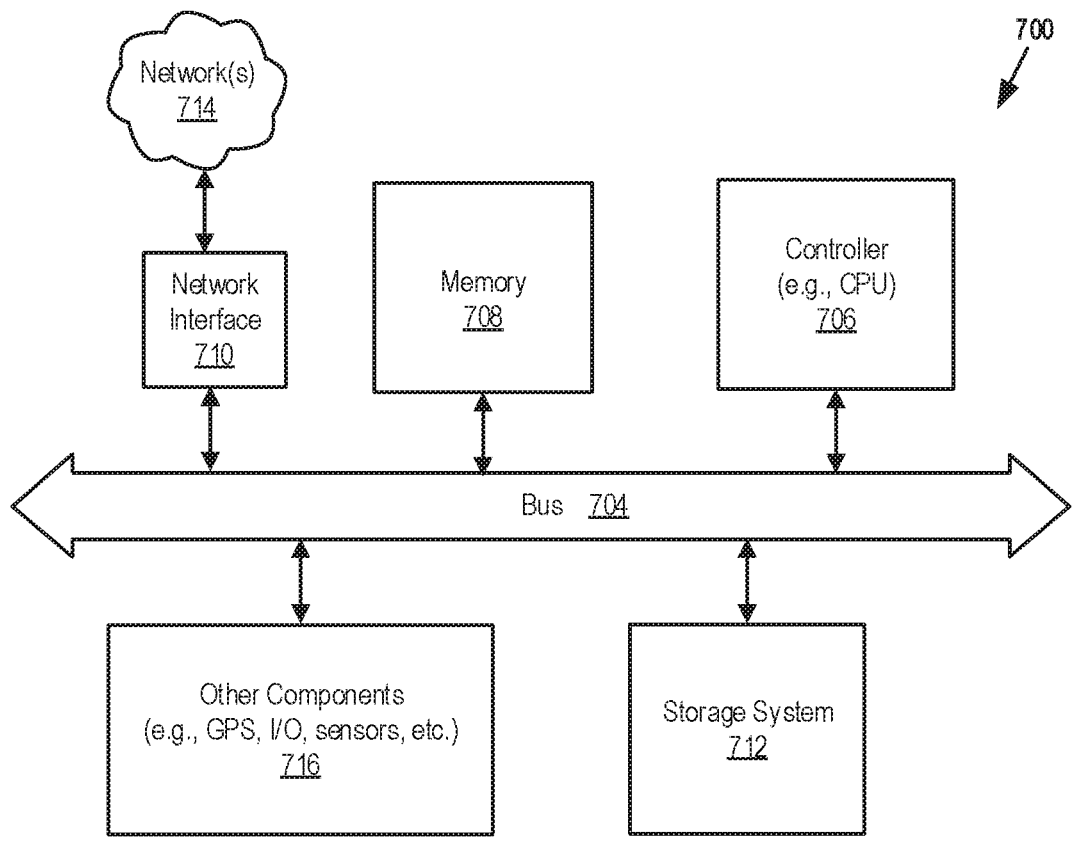
FIG. 7 illustrates an example computing device that can implement creation of customized root processes for individual applications, in accordance with some embodiments of the present disclosure.

FIG. 7 illustrates an example computing device 700 that can implement creation of customized root processes for individual applications, in accordance with some embodiments of the present disclosure. The device 700 can be or include or be a part of mobile device 102 or any other type of computing device that is or is somewhat similar to a mobile device—such as a smartphone, tablet computer, IoT device, smart television, smart watch, glasses or other smart household appliance, in-vehicle information system, wearable smart device, game console, PC, digital camera, or any combination thereof. As shown, the device 700 can be connected to communications network(s) 714 that includes at least a wide area network (WAN), a local area network (LAN), an intranet, a mobile wireless network such as 4G or 5G, an extranet, the Internet, and/or any combination thereof.

Each of the computing or mobile devices described herein (such as mobile device 102 or computing device 700) can be or be replaced by a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine.

Also, while a single machine is illustrated for the device 700 shown in FIG. 7 as well as the mobile device 102 shown in FIGS. 1 and 3, the term "machine" shall also be taken to include any collection of machines that individually or jointly execute a set (or multiple sets) of instructions to perform any one or more of the methodologies or operations discussed herein. And, each of the illustrated computing or mobile devices can each include at least a bus and/or motherboard, one or more controllers (such as one or more CPUs), a main memory that can include temporary data storage, at least one type of network interface, a storage system that can include permanent data storage, and/or any combination thereof. In some multi-device embodiments, one device can complete some parts of the methods described herein, then send the result of completion over a network to another device such that another device can continue with other steps of the methods described herein.

FIG. 7 also illustrates example parts of the example computing device 700, in accordance with some embodiments of the present disclosure. The device 700 can be communicatively coupled to the network(s) 714 as shown. The device 700 includes at least a bus 704, a controller 706 (such as a CPU), memory 708, a network interface 710, a data storage system 712, and other components 716 (which can be any type of components found in mobile or computing devices such as GPS components, I/O components, and sensors). The other components 716 can include one or more displays, different types of sensors, audio and/or visual input/output devices, additional application-specific memory, one or more additional controllers (e.g., GPU), or any combination thereof. The bus 704 communicatively couples the controller 706, the memory 708, the network interface 710, the data storage system 712 and the other components 716. The device 700 includes a computer system that includes at least controller 706, memory 708 (e.g., read-only memory (ROM), flash memory, dynamic random-access memory (DRAM) such as synchronous DRAM (SDRAM) or Rambus DRAM (RDRAM), static random-access memory (SRAM), etc.), and data storage system 712, which communicate with each other via bus 704 (which can include multiple buses).

To put it another way, FIG. 7 is a block diagram of an example device 700 having a computer system in which embodiments of the present disclosure can operate. In some embodiments, the computer system can include a set of instructions, for causing a machine to perform any one or more of the methodologies discussed herein, when executed. In such embodiments, the machine can be connected (e.g., networked via network interface 710) to other machines in a LAN, an intranet, an extranet, and/or the Internet (e.g., network(s) 714). The machine can operate in the capacity of a server or a client machine in client-server network environment, as a peer machine in a peer-to-peer (or distributed) network environment (such as the peer-to-peer networks described herein), or as a server or a client machine in a cloud computing infrastructure or environment.

Controller 706 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, single instruction multiple data (SIMD), multiple instructions multiple data (MIMD), or a processor implementing other instruction sets, or processors implementing a combination of instruction sets. Controller 706 can also be one or more special-purpose processing devices such as an application specific integrated circuit (ASIC), a field programmable gate array (FPGA), a digital signal processor (DSP), network processor, or the like. Controller 706 is configured to execute instructions for performing the operations and steps discussed herein. Controller 706 can further include a network interface device such as network interface 710 to communicate over one or more communications network (such as network(s) 714).

The data storage system 712 can include a machine-readable storage medium (also known as a computer-readable medium) on which is stored one or more sets of instructions or software embodying any one or more of the methodologies or functions described herein. The instructions can also reside, completely or at least partially, within the memory 708 and/or within the controller 706 during execution thereof by the computer system, the memory 708 and the controller 706 also constituting machine-readable storage media. The memory 708 can be or include main memory of the device 700.

While the memory, controller, and data storage parts are shown in the example embodiment to each be a single part, each part should be taken to include a single part or multiple parts that can store the instructions and perform their respective operations. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Figure 8:
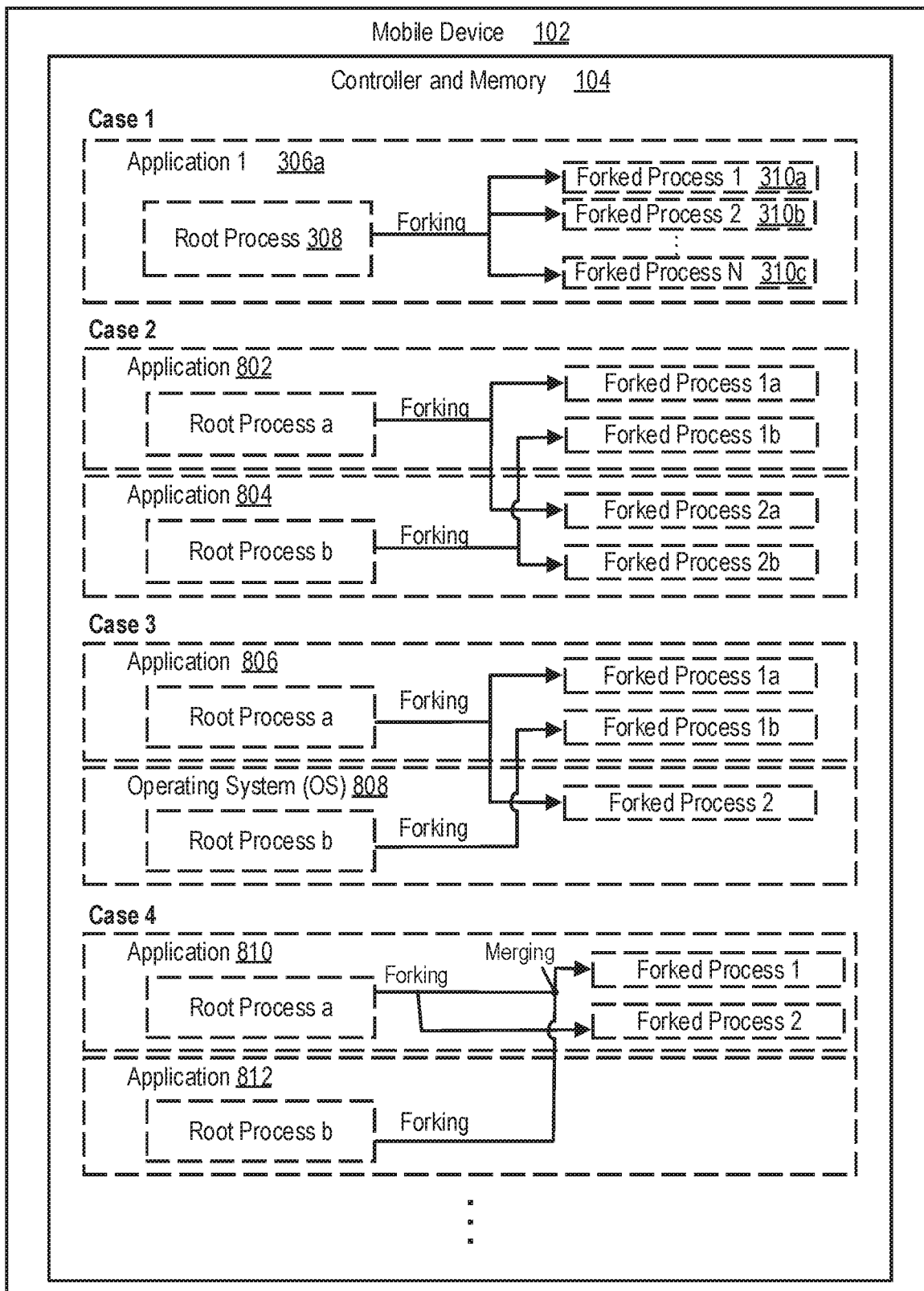
FIG. 8 illustrates the example mobile device depicted in FIGS. 1 and 3 including example alternatives of root processes, in accordance with some embodiments of the present disclosure.

FIG. 8 illustrates the mobile device 102 depicted in FIGS. 1 and 3 including example alternatives of root processes, in accordance with some embodiments of the present disclosure. As shown in FIG. 8, the mobile device 102 includes the controller and memory 104 and four example cases of alternatives of root processes (see example cases 1, 2, 3, and 4 shown in FIG. 8). The mobile device 102 shown in FIG. 8 can also include aspects of the mobile device 102 shown in FIGS. 1 and 3.

The first example case shown in FIG. 8 is case 1. In case 1, application 306*a* is depicted as it is shown in FIG. 3. Application 306*a* includes a root process 308 that is forked into multiple forked processes (e.g., see forked processes 310*a*, 310*b*, and 310*c*).

The second example case shown in FIG. 8 is case 2. In case 2, application 802 includes a root process "a" and application 804 includes a root process "b". In case 2, different root processes are shown being used by multiple applications. This is a many-to-many mapping example, which is a superset of many-to-one mapping examples. A root process for an application can be used by two or more applications. Also, one-to-many mapping examples can be used in some embodiments described herein. For example, multiple different root processes can be used by a single application. As shown in FIG. 8, in case 2, root process "a" of application 802 is forked into forked process 1*a* and 2*a*, and process 1*a* is being used by application 802 and process 2*a* is being used by application 804. Also shown, in case 2, root process "b" of application 804 is forked into forked process 1*b* and 2*b*, and forked process 1*b* is being used by application 802 and process 2*b* is being used by application 804.

The third example case shown in FIG. 8 is case 3. In case 3, application 806 includes a root process "a" and operating system 808 (which is an OS of the mobile device 102) includes a root process "b". In case 3, the root process "a" is forked into at least forked processes 1*a* and 2 and the root process "b" is forked into at least forked process 1*b*. In case 3, the OS-generated forked process (forked process 1*b*) can be used by one or multiple applications (e.g., FIG. 8 shows the OS-generated forked process being used by application 806). And, the OS 808 can request a forked process from any application to modify and/or generate its own processes (e.g., see forked process 2 forked from root process "a" of application 806, which is shown being used by the OS). And, other applications besides the OS can use the forked process 2 forked from root process "a" of application 806.

The fourth example case shown in FIG. 8 is case 4. In case 4, application 810 includes a root process "a" and application 812 includes a root process "b". In case 4, forked processes 1 and 2 are forked from root process "a" of application 810, and at least forked process 1 is also forked from root process "b" of application 812. Case 4 shows merging two forked processes from different applications into one forked process (e.g., see forked process 1). In some examples the forked processes from different applications can be different forked processes that are merged into a combined and merged forked process. In some other examples, the forked processes that are merged can include the same processes and/or data. Implementation of the merge shown in case 4 of FIG. 8 can be done via merged forking which can include a special forking process that includes merging of forked processes. The special forking process can be an OS system call. The special forking with merging can use one or more processes as input (e.g., each represented by bytecode) and merge the process(es) into one referenced process. It can use a merge schema (such as a merged schema described by an XML file). The merge schema can point to sections of bytecode and data and each section can represent a certain function call or task. The merge schema can also provide instructions for the merging of each section (e.g. substituted by relevant section in first process by one in a second process, or inserted in the first process A, etc.).

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   executing, in a mobile device, a root process of an application to an initial point according to patterns of prior executions of the application;
   generating the patterns of prior executions of the application according to a frequency or a recency of reads from or writes to memory for the application;
   forking, by an operating system (OS) in the mobile device, the root process of the application into multiple processes;
   receiving a request to start the application from a user of the mobile device;
   starting the application in the mobile device upon receiving the request to start the application and by using at least one of the multiple processes according to the request to start the application;
   receiving a request to end the application from the user of the mobile device;
   at least partially ending the application upon receiving the request to end the application; and
   continuing to run the root process of the application upon receiving the request to end the application.

2. The method of claim 1, wherein at least one of the executing, receiving, or starting is performed by the operating system (OS) in the mobile device.

3. The method of claim 1, wherein at least some of the multiple processes are different from the root process.

4. The method of claim 1, wherein the patterns of prior executions of the application are from use of the application on the mobile device by the user and other users so that the root process is customized for use of the application on the mobile device by any user.

5. The method of claim 1, wherein the patterns of prior executions of the application are from use of the application on the mobile device by the user so that the root process is customized for use of the application on the mobile device by the user.

6. The method of claim 1, wherein the patterns of prior executions of the application are from use of the application on the mobile device and at least one other computing device by the user so that the root process is customized for use of the application on the mobile device and the at least one other computing device by the user.

7. The method of claim 1, wherein the executing the root process of the application comprises moving data in the memory before any initial writes to the memory for the application, wherein the moved data comprises data related to the patterns of prior executions of the application.

8. The method of claim 7, wherein the moving data in the memory before any initial writes to the memory comprises avoiding moving common code and read-only data.

9. The method of claim 7, comprising, after an operating system (OS) in the mobile device forks a root process for the OS, executing predicted initial writes for the application to customize the executing of the root process of the application.

10. The method of claim 1, comprising storing data for the root process of the application in flash memory.

11. The method of claim 1, comprising storing data for the root process of the application in non-volatile random-access memory (NVRAM).

12. The method of claim 11, wherein the NVRAM comprises 3D XPoint memory.

13. The method of claim 1, comprising:
   monitoring usage of the application to determine the frequency or recency of reads from and writes to the memory for the application.

14. The method of claim 1, comprising:
   receiving a request to end the application from the user of the mobile device;
   at least partially ending the application and the root process of the application upon receiving the request to end the application; and
   after at least partially ending the application and the root process, at least partially re-executing the root process according to a predetermined condition.

15. The method of claim 14, wherein the at least partially re-executing of the root process is based on or updated by the patterns of prior executions of the application.

16. A non-transitory computer-readable storage medium tangibly encoded with computer-executable instructions, that when executed by a processor associated with a mobile device, cause the processor to:
- execute, in the mobile device, a root process of an application to an initial point according to patterns of prior executions of the application;
- generate the patterns of prior executions of the application according to a frequency or a recency of reads from or writes to memory for the application;
- fork, by an operating system (OS) in the mobile device, the root process of the application into multiple processes;
- receive a request to start the application from a user of the mobile device;
- start the application in the mobile device upon receiving the request to start the application and by using at least one of the multiple processes according to the request to start the application;
- receive a request to end the application from the user of the mobile device;
- at least partially end the application upon receipt of the request to end the application; and
- continue to run the root process of the application upon receipt of the request to end the application.

17. A method, comprising:
- executing, by an operating system (OS) in a computing device, a root process of an application as a background process according to patterns of prior executions of the application;
- generating the patterns of prior executions of the application according to a frequency or a recency of reads from or writes to memory for the application;
- forking, by the OS, the root process of the application into multiple processes;
- receiving, by the OS, a request to start the application from a user of the computing device;
- starting, by the OS, the application in the computing device upon receiving the request to start the application and by using at least one of the multiple processes according to the request to start the application;
- receiving a request to end the application from the user of the computing device;
- at least partially ending the application upon receiving the request to end the application; and
- continuing to run the root process of the application upon receiving the request to end the application.

* * * * *